United States Patent

Frederick et al.

[11] Patent Number: 6,134,465
[45] Date of Patent: Oct. 17, 2000

[54] METHOD FOR REDUCING ARTIFACTS IN MR IMAGE ACQUIRED WITH PHASED ARRAY SURFACE COIL

[75] Inventors: Perry S. Frederick, Waukesha; John A. Johnson, Delafield, both of Wis.

[73] Assignee: General Electric Company, Milwaukee, Wis.

[21] Appl. No.: 09/096,902

[22] Filed: Jun. 12, 1998

[51] Int. Cl.[7] ..................................................... A62B 5/05
[52] U.S. Cl. ............................................................. 600/410
[58] Field of Search ..................................... 600/407, 410, 600/421, 422, 424, 425; 324/307, 309, 316, 317, 318, 322; 382/131

[56] References Cited

U.S. PATENT DOCUMENTS

| | | | |
|---|---|---|---|
| 5,399,970 | 3/1995 | Pelc et al. | 324/309 |
| 5,551,430 | 9/1996 | Blakeley et al. | 600/410 |
| 5,600,244 | 2/1997 | Jensen et al. | 324/309 |
| 5,910,728 | 6/1999 | Sodickson | 324/309 |
| 5,928,148 | 7/1999 | Wang et al. | 600/420 |
| 5,945,826 | 8/1999 | Leussler | 324/309 |

*Primary Examiner*—Marvin M. Lateef
*Assistant Examiner*—Ali M. Imam
*Attorney, Agent, or Firm*—Skarsten Law Offices; Christian G. Cabou; Phyllis Y. Price

[57] ABSTRACT

In an MR system employing a phased array surface coil, a method is provided for reducing artifacts in an MR image acquired from a region of an object lying within a specified field of view, wherein the field of view has a dimension extending between first and second boundary limits. The method includes the step of positioning the phased array surface coil, which comprises a linear array of coil elements, in selected spatial relationship with the object region. The method further comprises selecting a particular coil element for use in acquiring MR data only if the coil element lies at least partially in a range which extends along the phased array and has a length equal to the field of view dimension, the range lying between positions respectively corresponding to the first and second boundary limits. Each of the selected coil elements is operated to acquire MR data from respectively corresponding subregions of the object region, and the MR image is constructed only from MR data acquired by respective selected coil elements.

16 Claims, 4 Drawing Sheets

METHOD FOR REDUCING ARTIFACTS IN MR IMAGE ACQUIRED WITH PHASED ARRAY SURFACE COIL

BACKGROUND OF THE INVENTION

The invention disclosed and claimed herein generally pertains to an improved method for reducing artifacts in a magnetic resonance (MR) image acquired by means of a phased array surface coil. More particularly, the invention pertains to a method of the above type wherein only a subset, i.e., fewer than all, of the coil elements forming the array are used to acquire the MR data needed for the image. Even more particularly, the invention pertains to a method of the above type wherein an MR scanner or system employed to implement the method of the invention can be readily programmed by an operator to automatically select the respective coil elements of the subset which are to be used in acquiring the MR data.

As is well known to practitioners in the field of MR imaging, phased array surface coils have been developed to overcome certain deficiencies in other types of MR receivers. More specifically, a phased array coil provides an MR receiver which generally has better signal to noise ratio than a volume coil receiver, and at the same time does not diminish field of view, as tends to happen with a surface coil. Phased array receivers have been found to be particularly useful in imaging elongated structures, such as the cervic, thoracic and lumbar regions of the spine.

As is further well known, phased array surface coils are subject to artifacts which can occur in MR imaging whenever necessary magnetic field values, such as the $B_0$ or gradient fields, are replicated or repeated at more than one location within an MR signal source (i.e., within an imaging subject). Such artifacts derive primarily from the fact that gradient and magnetic coils have finite lengths. Accordingly, the $B_0$ and gradient fields of an MR scanner become increasingly non-linear away from the isocenter of the scanner main magnet. For example, the ideal $G_z$ gradient field, which is linear with respect to the Z-axis, should have a different value at each Z-axis position. However, because of the non-linearity, the $G_z$ field could be the same at two widely separated Z-axis positions, on opposing sides of the isocenter. As a result, MR signals detected at both positions by a receiver could be accepted for use in constructing an image, even though one of the positions was actually outside the image field of view. The MR signal from such position would thereby cause an artifact.

In a phased array surface coil, such peripheral signal artifacts can appear as either a bright spot or as a ribbon of signal smeared through the image. The bright spot artifacts are frequently referred to as Startifacts, and the ribbon artifacts may be referred to as Annefacts.

SUMMARY OF THE INVENTION

The invention is generally directed to a method of operating an MR system or scanner to provide an MR image of the region of an object lying within a specified field of view, wherein the field of view has a dimension which extends between first and second boundary limits. In accordance with the method, a phased array surface coil comprising a plurality of coil elements is positioned in selected spatial relationship with the object region. The method further comprises the step of identifying or selecting certain coil elements of the array for use in acquiring data, a particular coil element being selected if it lies at least partially in a range which extends along the phased array and has a length equal to the field of view dimension, the range lying between positions respectively corresponding to the first and second boundary limits. The selected coil elements are operated to acquire MR data from respectively corresponding subregions of the object region, and an MR image is constructed using only the MR data acquired by the selected coil elements.

In a preferred embodiment of the invention, wherein the phased array surface coil comprises a linear array of coil elements and the MR system is provided with a main magnet having an isocenter, the positioning step comprises positioning the phased array surface coil so that each of the coil elements of the array is located at a fixed known distance from the isocenter. The coil element selecting step comprises determining the locations of the first and second boundary limits with respect to the isocenter, and selecting a coil element only if it is positioned between the locations of the first and second boundary limits, relative to the isocenter.

In a useful embodiment, the dimension of the field of view extending between the first and second boundary limits is known, and the respective locations of the boundary limits are determined from such dimension and from a known distance between the isocenter and a landmark on the object which is positioned midway between the first and second boundary limits. To determine the locations of the first and second ends of respective coil elements with respect to the isocenter, the locations of the first and second ends of a given coil element are each compared with the locations of the first and second boundary limits, to determine whether the given coil element is positioned therebetween.

OBJECTS OF THE INVENTION

An object of the invention is to provide an improved and simplified method for reducing artifacts in an MR image acquired by means of a phased array surface coil.

Another object is to provide a method of the above type wherein certain coil elements of the phased array, i.e., the elements which acquire MR data only from the region of an object lying within the image field of view, are identified or selected for a coil element subset which is used exclusively for image data acquisition.

Another object is to provide a method of the above type, wherein any data acquired by coil elements of the array which are not included in the subset is disregarded for use in image reconstruction.

Another object is to provide a method of the above type, wherein an MR scanner operator can readily direct the scanner to automatically identify or select the coil elements of the array which are to be included in the subset, merely by providing some readily available parameters.

These and other objects and advantages of the invention will become more readily apparent from the following description, taken together with the accompanying drawings.

DETAILED DESCRIPTION OF THE PREFERRED EMBODIMENT

Figure 1:
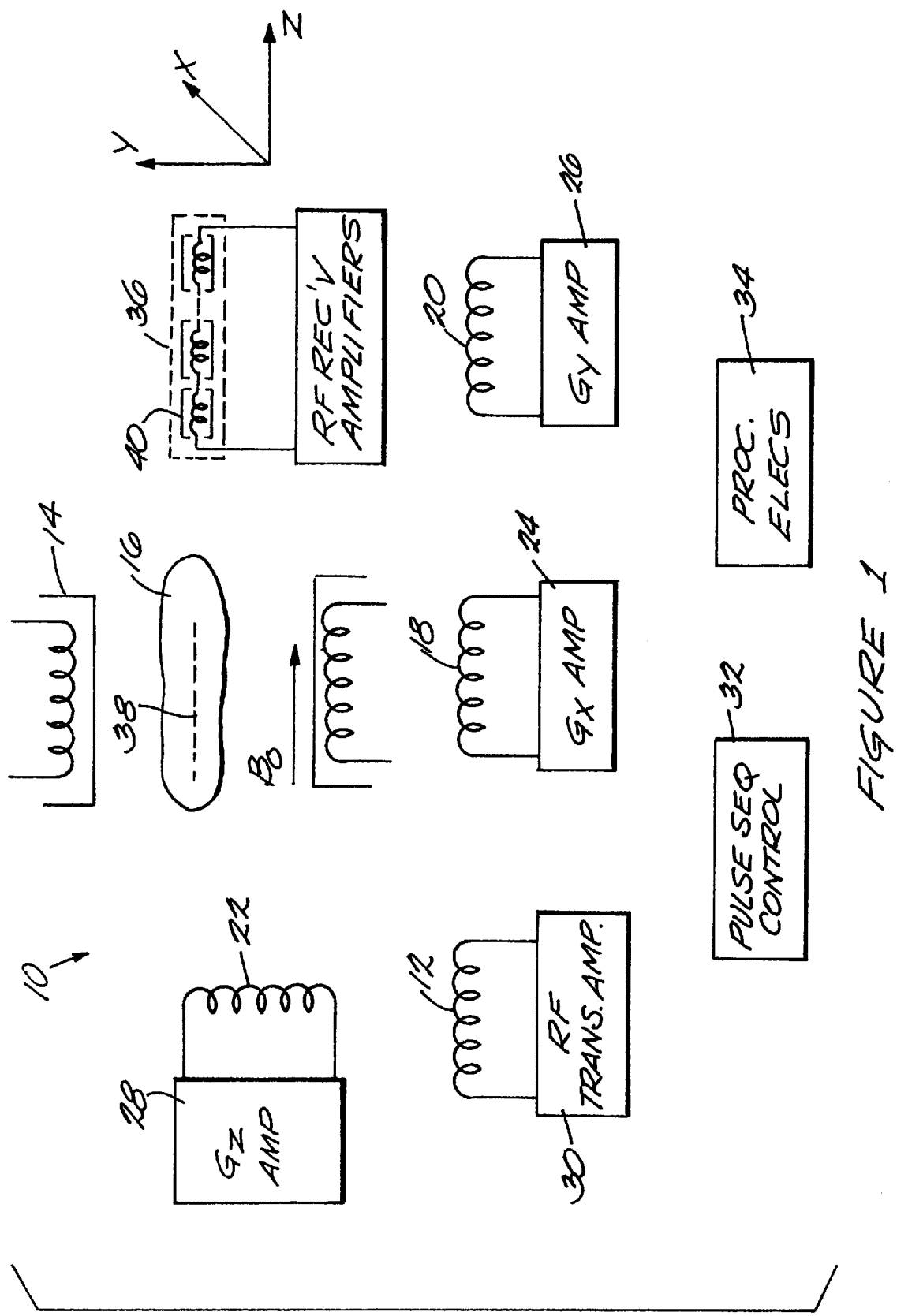
FIG. 1 is a schematic diagram showing basic components of an MR system for use in practicing an embodiment of the invention.

Referring to FIG. 1, there are shown the basic components of an MR system 10 which may be operated to acquire MR data, as described herein. System 10 includes an RF transmit coil 12, as well as a magnet 14 for generating a main or static magnetic field $B_0$ in the cylindrical bore of the magnet. RF coil 12 is operated to transmit RF excitation signals into a patient or other object of imaging 16 residing in the magnet bore, in order to produce MR signals. System 10 further includes gradient coils 18, 20 and 22 for generating $G_x$, $G_y$, and $G_z$ magnetic field gradients relative to orthogonal X-, Y- and Z- references axes, respectively. FIG. 1 shows each of the gradient coils 18, 20 and 22 respectively driven by gradient amplifiers 24, 26 and 28, and RF coil 12 driven by transmit amplifier 30.

Referring further to FIG. 1, there is shown system 10 provided with a phased array surface coil 36, which is operated in association with a set of RF receive amplifiers, described hereinafter in further detail, to acquire or detect MR signals from object 16, such as from a slice or region 38 thereof. Phased array coil 36 comprises a linear array of coil elements 40. System 10 is further provided with a pulse sequence control 32, which is operated to control the RF and gradient amplifiers, and to thereby generate pulse sequences to produce and acquire sets of MR image data. System 10 also includes computation and processing electronics 34 for constructing an image from acquired data, in accordance with the invention. The construction, functions, and inter-relationships of the respective components of MR system 10, except for principles of the invention described herein, generally are well known and described in the prior art, such as in U.S. Pat. No. 5,672,969, issued Sep. 30, 1997 to Zhou et al.

Figure 2:
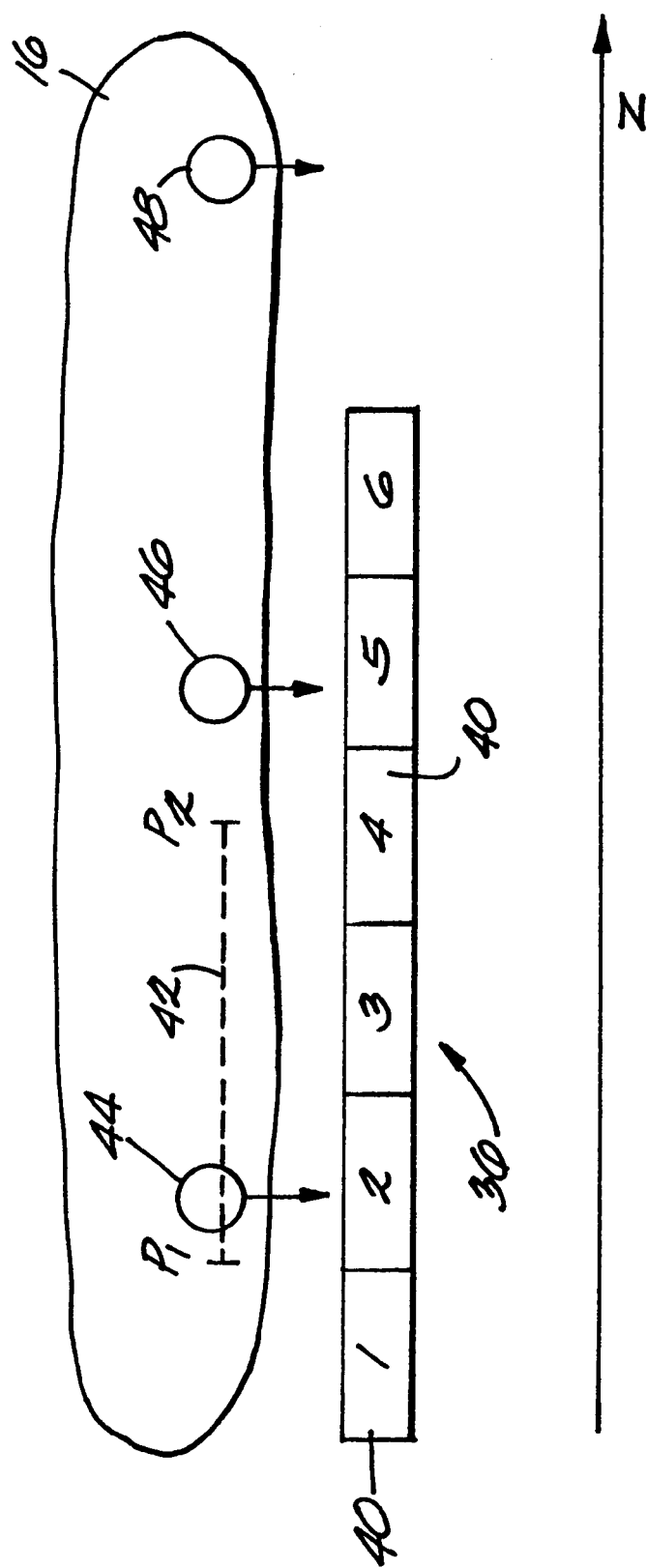
FIG. 2 is a schematic diagram useful for illustrating the cause of certain artifacts in an image generated by means of a phased array surface coil.

Referring to FIG. 2, there is shown a patient or other object 16 positioned with respect to the Z-axis of the MR system. For example, object 16 could be completely or partially contained in the bore of main magnet 14. There is further shown respective elements 40 of phased array surface coil 36 extending along the Z-axis, in substantially parallel relationship therewith, and in spaced-apart relationship with object 16. Coil elements 40 thus comprise a linear array, and are respectively numbered 1–6. Coil 36 is provided to detect MR signal from a region of object 16 lying within a field of view 42, which has a dimension along the Z-axis bounded by limits $P_1$ and $P_2$. Such region could usefully comprise a portion of the spine of a patient 16.

Referring further to FIG. 2, there is shown a portion or subregion 44 of the object region lying within field of view 42. In accordance with well known principles of MR imaging, MR signal is excited in subregion 44 of object 16 by the combined action of the $B_0$ field produced by magnet 14, and the $B_1$ excitation field provided by RF transmit coil 12. The location of subregion 44 is identified by the $G_x$, $G_y$ and $G_z$ gradient fields. The MR signal excited in object subregion 44 is detected or received by coil element number 2 of phased array 36, which is the closest element to the subregion 44, and which lies directly beneath such subregion, as viewed in FIG. 2.

FIG. 2 also shows subregions 46 and 48 of object 16, in which MR signal is likewise excited by the $B_0$ and $B_1$ fields. Neither of such subregions is included within the field of view 42. However, because of $G_z$ gradient non-linearity, as described above, MR signal from both of such regions appears to be within the field of view. If such MR signals were to be detected, they would cause artifacts in a reconstructed image of the region lying within the field of view. The signal from subregion 48 would generally not be of significant concern, since none of the coil elements of array 36 is adjacent thereto to receive it. However, the signal from subregion 46 would be detected by coil element number 5, which is closely spaced therefrom. Thus, a distorting image artifact could be produced by such detected signal.

In accordance with the invention, it has been recognized that it would be very advantageous to provide a comparatively simple technique for identifying coil elements 40 of phased array 36 which are positioned close to the region of object 16 lying within the field of view 42, or are directly below such region as viewed in FIG. 2, and which therefore receive the MR data which is required for accurate reconstruction of an image of such region. Such identification would enable deactivation of the remaining coil elements 40 during data acquisition. Alternatively, measures could be taken to prevent MR data acquired by such remaining coil elements from being used in image reconstruction, in order to prevent artifacts resulting therefrom. Moreover, it would be beneficial to configure an MR scanner, such as system 10, so that the coil element identification can be carried out automatically, after a system operator furnishes the scanner with two or three readily available parameters.

Figure 3:
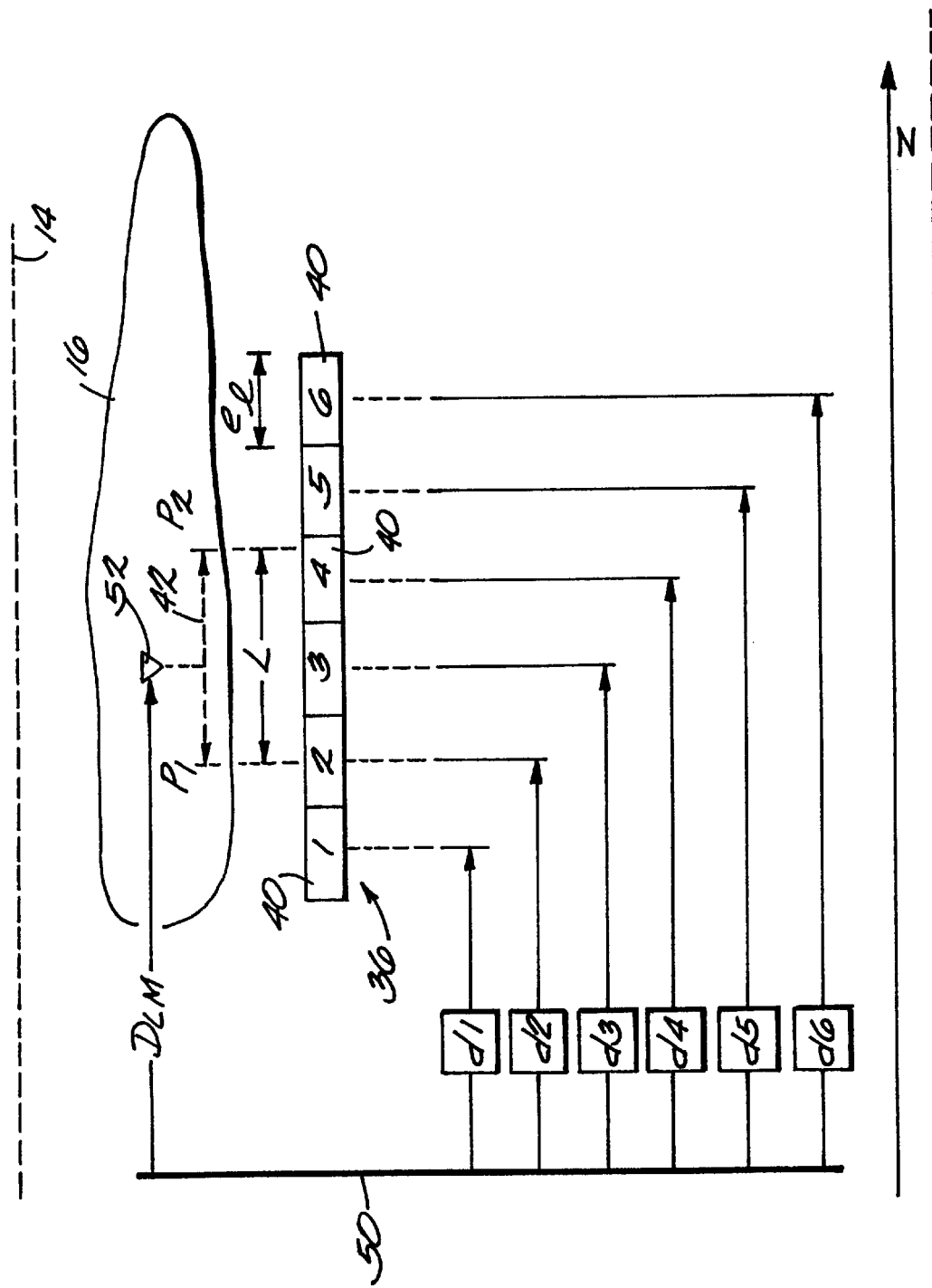
FIG. 3 is a schematic diagram useful for illustrating principles of the invention.

Referring to FIG. 3, there are shown object 16 and phased array surface coil 36 positioned with respect to each other, as well as to the Z-axis and main magnet 14 of MR system 10, as described above in connection with FIG. 2. In addition, each of the coil elements 40 of array 36 is positioned in fixed, known relationship with the isocenter 50 of main magnet 14. Thus, the center of coil element number 1 is a distance $d_1$ from isocenter 50, and more generally the center of the ith coil element is a distance $d_i$ from the isocenter. For purposes of illustration, each of the coil elements 40 is provided with the same length $e_1$ along the Z-axis, although the invention is not limited thereto. Thus, the rightward and leftward ends of the ith coil element with respect to the Z-axis, as viewed in FIG. 3, are positioned at $d_i+e_1/2$ and $d_i-e_1/2$, respectively. Such positional information for respective elements 40 may be stored in a look-up table, which is not shown but which may usefully be included in the MR system electronics 34.

Referring further to FIG. 3, there is shown a reference mark, or landmark 52 placed on object 16, at a known distance $D_{LM}$ from isocenter 50 along the Z-axis. If the dimension of field of view 42 between boundary limits $P_1$ and $P_2$ is specified to be a length L, and if the midpoint of such dimension is located at landmark 52, the position of boundary limit $P_1$, relative to the isocenter, can be readily determined from the expression $P_1=D_{LM}-L/2$. Similarly, the position of boundary limit $P_2$ can be determined from the expression $P_2=D_{LM}+L/2$.

After the position of $P_1$ has been determined, a conventional logic circuit (not shown) residing in electronics 34 can systematically compare $P_1$ with each value $d_i+e_1/2$ stored in the look-up table. If it is found that $P_1>d_i+e_1/2$, it is clear that the rightward end of the ith coil element 40 lies to the left of the left boundary limit of field of view 42, as viewed in FIG. 3. FIG. 3 shows this to be the case, for example, for coil element number 1 since the rightward end thereof is seen to be closer to isocenter 50 than the boundary limit $P_1$. Accordingly, no portion of coil element number 1 lies beneath field of view 42, as viewed in FIG. 1, so that such coil element will not receive MR signal from any part of the region of object 16 lying within the field of view.

In like manner, $P_2$ may be compared with each value $d_i-e_1/2$ stored in the look-up table, that is, with positions of the leftward ends of respective coil elements 40. If $P_2 < d_i - e_1/2$, the leftward end of the ith coil element lies to the right of the right boundary limit of field of view 42, as viewed in FIG. 3. FIG. 3 shows such condition for coil elements nos. 5 and 6. Thus, such coil elements likewise will not receive MR signal from the region of object 16 lying within the field of view.

It is thus seen that comparison of $P_1$ and $P_2$ with the end positions of respective coil elements provides a very simple and expedient procedure for identifying the subset of coil elements 40 receiving MR data which is actually of use for constructing an image of the field of view region. More specifically, the ith element should be included in the subset only if both the conditions $P_1 \leq d_i + e_1/2$ and $P_2 \geq d_i - e_1/2$ are met. Thus, $P_1$ and $P_2$ projected onto phased array 36 define a range of length L. A coil element 40 is included in the subset if any part thereof lies within the range. For the field of view 42 shown in FIG. 3, the subset of interest comprises coil element nos. 2, 3 and 4. The remaining coil elements should not be used to acquire data for the image.

It is to be emphasized that in order to select the coil elements of interest for a particular field of view, it is only necessary to specify the parameters $D_{LM}$ and L. Such information may be readily supplied to a scanner by the operator thereof, whereupon the computation and processing electronics 34 can proceed to carry out the comparisons described above.

Figure 4:
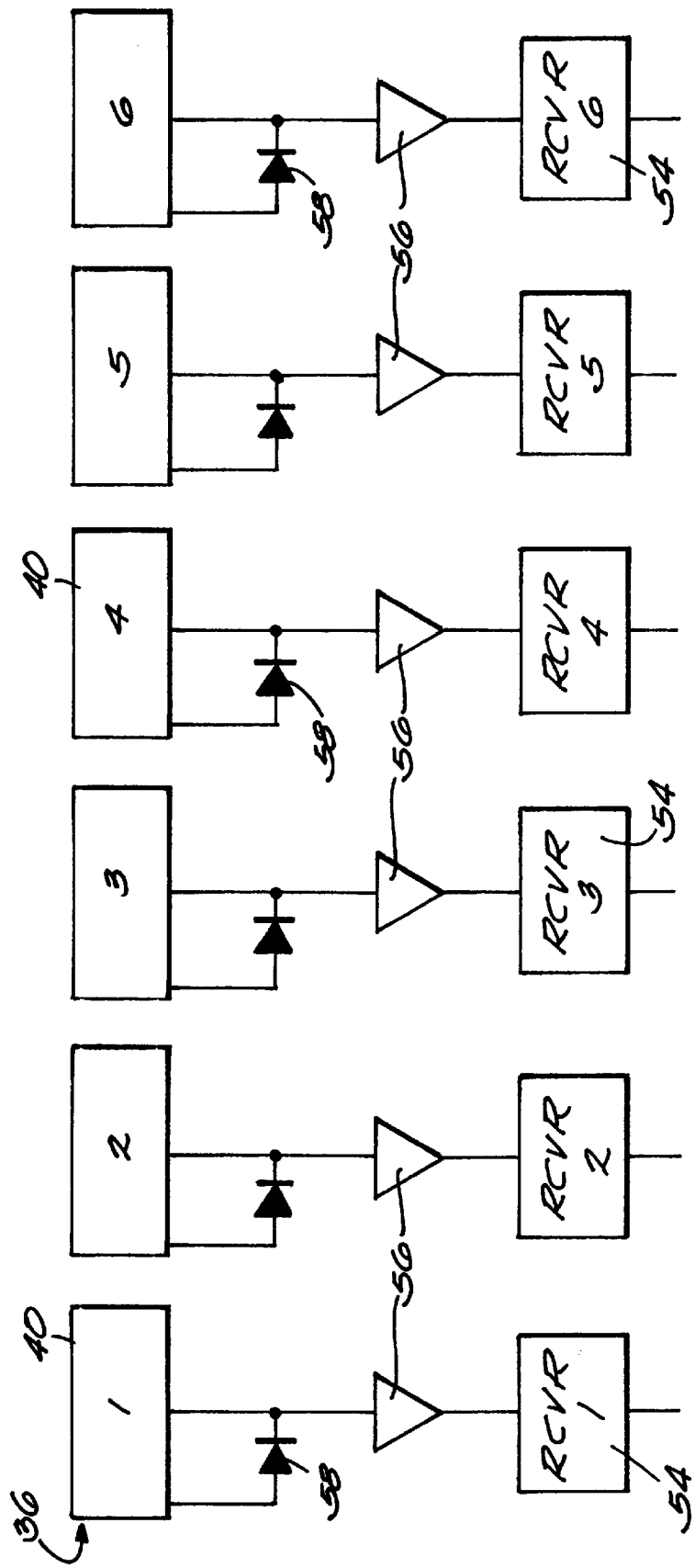
FIG. 4 is a schematic diagram illustrating an arrangement for practicing one or more embodiments of the invention.

Referring to FIG. 4, there is shown each of the coil elements 40 of phased array surface coil 36 coupled to a corresponding receiving amplifier or receiver 54, through a pre-amplifier 56. Each coil element is also provided with a blocking network 58, comprising a pin diode. A coil element may be deactivated, to prevent it from acquiring MR data for the reasons set forth above, by selectively operating its blocking network 58. However, for certain types of commercially available scanners, it could be very inconvenient to disable or turn off individual coil elements. In some cases, substantial redesign and retrofit of the phased array coil hardware would be necessary. Accordingly, in an alternative arrangement, each of the coil elements 40 of array 36 would be allowed to acquire data. However, if it was determined that a coil element was not included in the subset of interest, in accordance with the procedures described above, the receiver 54 coupled thereto would be disconnected from the signal processing electronics 34, such as by operation of the control 32. Thus, data acquired by the particular coil element would not be available for image reconstruction.

In another embodiment of the invention, the algorithm employed by computation and processing electronics 34 for image reconstruction could be modified to exclude or ignore data from any coil element 40 which was not included in the coil element subset of interest.

Obviously, many other modifications and variations of the present invention are possible in light of the above teachings. It is therefore to be understood that within the scope of the disclosed concept, the invention may be practiced otherwise than as specifically described.

What is claimed is:

1. In an MR system, a method for providing an MR image of the region of an object lying within a specified field of view, the field of view having a dimension which extends between first and second boundary limits, said method comprising the steps of:

positioning a phased array surface coil comprising a plurality of coil elements in selected spatial relationship with said object region;

selecting a subset of said coil elements for use in acquiring MR data, the number of coil elements in said subset being less than the number of coil elements in said phased array, a particular coil element being selected for said subset if it lies at least partially in a range extending along said phased array and having a length equal to said dimension, said range lying between positions respectively corresponding to said first and second boundary limits;

operating each of said coil elements of said subset to acquire MR data from respectively corresponding subregions of said object region; and constructing said MR image only from MR data acquired by said coil elements of said subset.

2. The method of claim 1 wherein said MR system is provided with a main magnet having an isocenter, and wherein said positioning step comprises:

positioning respective coil elements of said phased array to form a linear array extending along a specified axis, each of the coil elements of said linear array being located at a fixed known distance from said isocenter.

3. The method of claim 2 wherein said selecting step comprises:

determining the locations of said first and second boundary limits with respect to said isocenter; and selecting a coil element for use in acquiring MR data only if it is positioned between the locations of said first and second boundary limits with respect to said isocenter.

4. The method of claim 3 wherein each of said coil elements has first and second ends in opposing relationship with each other, and wherein:

said method includes determining the locations of said first and second ends of respective coil elements with respect to said isocenter; and the locations of the first and second ends of a given coil element are each compared with said first and second boundary limits to determine whether said given coil element should be selected for use in acquiring MR data.

5. The method of claim 4 wherein said dimension extending between said first and second boundary limits is known, and wherein:

the respective locations of said first and second boundary limits are determined from said dimension, and from a known distance between said isocenter and a landmark on said object which is positioned midway between said first and second boundary limits.

6. The method of claim 5 wherein:

the locations of the first and second ends of a coil element are computed from a known length of the coil, and from a known distance between the midpoint of the coil element and the isocenter.

7. The method of claim 6 wherein:

each of the coil elements of said phased array which are not selected for use in acquiring MR data are respectively deactivated during data acquisition.

8. The method of claim 4 wherein:

said method includes storing respective locations of said first and second ends of said coil elements in a look-up table, prior to using said first and second end locations in said comparing step.

9. The method of claim 1 wherein:

said MR system includes receiving amplifiers respectively coupled to said coil elements, to receive the MR data respectively acquired thereby;

each of said coil elements of said phased array is enabled to acquire MR data associated with said object; and only data received by said receiving amplifiers which are respectively coupled to said selected coil elements is employed in constructing said MR image.

10. The method of claim 1 wherein:

each of said coil elements of said phased array is enabled to acquire MR data associated with said object; and said constructing step comprises operating a specified component of said MR system to implement an algorithm to construct said image, data acquired by any of said coil elements other than selected coil elements being disregarded in said implementation.

11. MR apparatus for providing an MR image of the region of an object lying within a specified field of view, the field of view having a dimension which extends between first and second boundary limits, said MR apparatus comprising:

means for exciting MR signal data within said region of said object;

a linear phased array surface coil comprising a plurality of coil elements positioned in selected spatial relationship with said object region, and extending along a specified axis;

an electronic circuit operable to select a subset of said coil elements for use in acquiring MR data, the number of coil elements in said subset being less than the number of coil elements in said linear phased array, said circuit being disposed to select a particular coil element for said subset if the particular coil element lies at least partially in a range extending along said phased array and having a length equal to said dimension, said range lying between positions respectively corresponding to said first and second boundary limits; and a receive amplifier coupled to each of said coil elements of said linear phased array, the receive amplifiers respectivily coupled to said selected coil elements of said subset being operable in association therewith to acquire MR data from respectively corresponding subregions of said object region for use in contruting said MR image.

12. The apparatus of claim 11 wherein:

said apparatus includes means coupled to said coil elements for respectively deactivating each of the coil elements of said phased array which is not selected for use in acquiring MR data during data acquisition.

13. The apparatus of claim 12 wherein:

said deactivating means comprises a blocking network coupled to each of said coil elements.

14. The apparatus of claim 13 wherein:

each of said blocking networks comprises a pin diode.

15. The apparatus of claim 14 wherein:

said means for exciting MR signal data comprises an MR main magnet and an RF transmit coil.

16. The apparatus of claim 15 wherein:

said main magnet has an isocenter, and each coil element of said phased array is located at a fixed known distance from said isocenter.

* * * * *